(12) United States Patent
Bramberger et al.

(10) Patent No.: US 11,719,848 B2
(45) Date of Patent: Aug. 8, 2023

(54) DEVICE FOR CONTROLLING, MONITORING AND VISUALIZING CONSTRUCTION SITES

(71) Applicant: Liebherr-Werk Biberach GmbH, Biberach an der Riss (DE)

(72) Inventors: Robert Bramberger, Mittelstetten/Vogach (DE); Martin Kögl, Biberach an der Riss (DE)

(73) Assignee: Liebherr-Werk Biberach GmbH, Biberach an der Riss (DE)

( * ) Notice: Subject to any disclaimer, the term of this patent is extended or adjusted under 35 U.S.C. 154(b) by 462 days.

(21) Appl. No.: 16/754,915

(22) PCT Filed: Oct. 8, 2018

(86) PCT No.: PCT/EP2018/077339
§ 371 (c)(1),
(2) Date: Apr. 9, 2020

(87) PCT Pub. No.: WO2019/072770
PCT Pub. Date: Apr. 18, 2019

(65) Prior Publication Data
US 2020/0319363 A1 Oct. 8, 2020

(30) Foreign Application Priority Data
Oct. 9, 2017 (DE) ............. 10 2017 123 391.1

(51) Int. Cl.
*G01V 3/12* (2006.01)
*G06F 30/13* (2020.01)
(Continued)

(52) U.S. Cl.
CPC ............... *G01V 3/12* (2013.01); *B66C 13/44* (2013.01); *G01V 3/36* (2013.01); *G01V 3/38* (2013.01);
(Continued)

(58) Field of Classification Search
CPC ... G01V 3/12; G01V 3/36; G01V 3/38; B66C 13/44; B66C 13/46; G06F 30/13; G06Q 10/08; G06Q 10/087
(Continued)

(56) References Cited

U.S. PATENT DOCUMENTS 2,470,374 A * 5/1949 Schaul ................... A23L 19/19
426/456
3,183,510 A * 5/1965 Rawls ..................... H01Q 1/04
343/803
(Continued)

FOREIGN PATENT DOCUMENTS

CN 101925917 A 12/2010
CN 205176940 U 4/2016
(Continued)

OTHER PUBLICATIONS

Office Action from Russian Application No. 2020113017 dated May 17, 2022 (with English translation).
(Continued)

*Primary Examiner* — Garcia Ade
(74) *Attorney, Agent, or Firm* — Troutman Pepper Hamilton Sanders LLP; Ryan A. Schneider; Celeste K. Walker

(57) ABSTRACT

A system for controlling and/or monitoring and/or visualizing construction sites, including a detection device for detecting the position of a construction unit at the construction site, wherein the detection device includes a signal transmitter to be mounted on the construction unit for providing an identification signal identifying the construction unit, and a signal evaluation device for receiving and evaluating the identification signal in order to determine the position of the construction unit at the construction site. The signal evaluation device includes at least one loop antenna that is laid at the construction site for receiving the identi-
(Continued)

Figure 1:
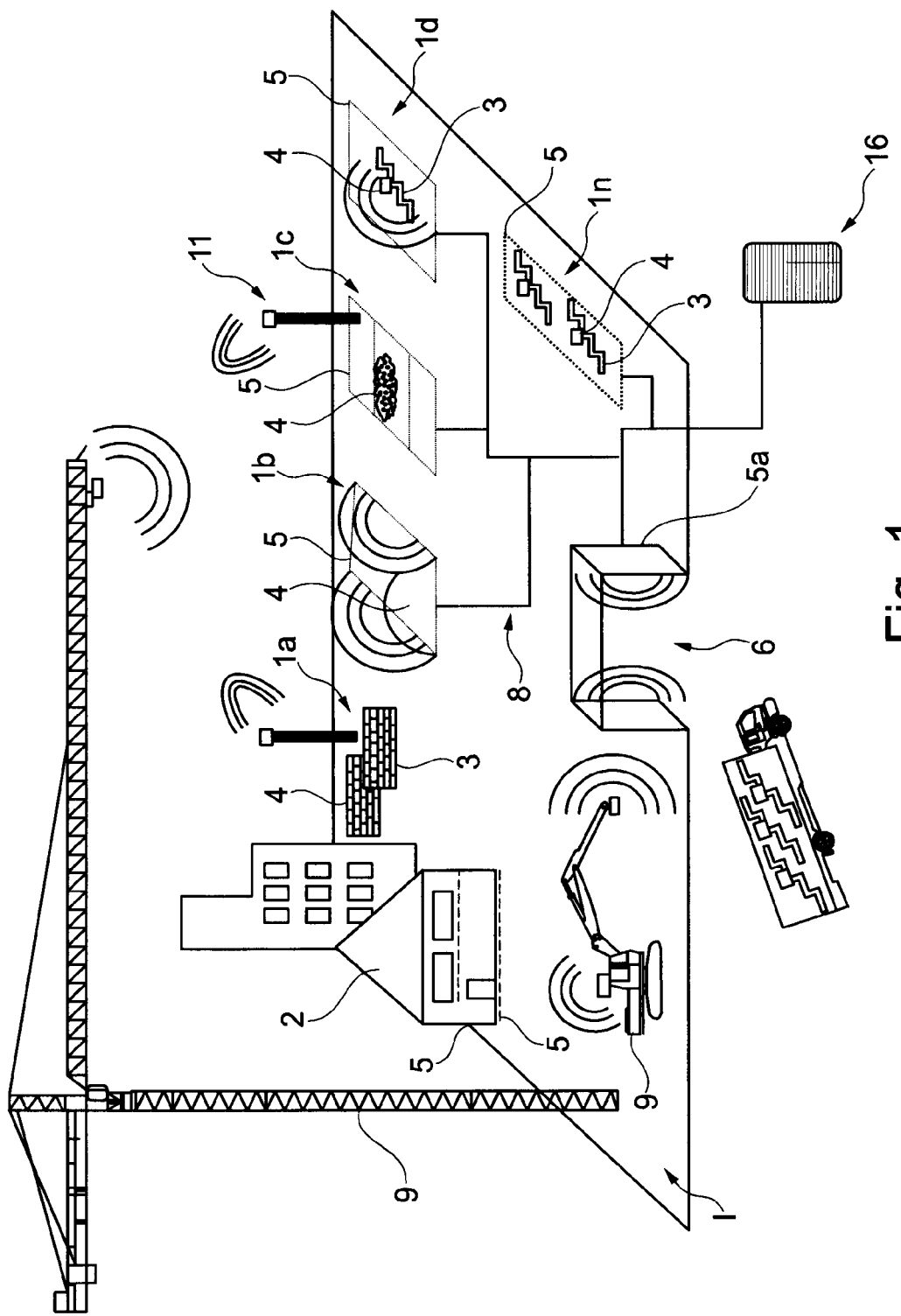

fication signal of the signal transmitter and for determining the position of the signal transmitter.

12 Claims, 3 Drawing Sheets

(51) Int. Cl.
  *G01V 3/36*    (2006.01)
  *G01V 3/38*    (2006.01)
  *G06Q 10/08*   (2023.01)
  *B66C 13/44*   (2006.01)
  *G08B 21/22*   (2006.01)
  *B66C 13/46*   (2006.01)

(52) U.S. Cl.
  CPC ............. *G06F 30/13* (2020.01); *G06Q 10/08* (2013.01); *B66C 13/46* (2013.01)

(58) Field of Classification Search
  USPC .......................................................... 703/1
  See application file for complete search history.

(56) References Cited

U.S. PATENT DOCUMENTS

| | | |
|---|---|---|
| 2009/0022138 A1 | 1/2009 | Gilchrist et al. |
| 2009/0219156 A1* | 9/2009 | August ................. G08B 21/22 340/10.5 |
| 2010/0265071 A1 | 10/2010 | August et al. |
| 2011/0018690 A1 | 1/2011 | August et al. |
| 2016/0034608 A1 | 2/2016 | Delplace |
| 2018/0170719 A1 | 6/2018 | Tasch et al. |

FOREIGN PATENT DOCUMENTS

| | | |
|---|---|---|
| DE | 102004055033 A1 | 8/2005 |
| DE | 202008011345 U1 | 1/2009 |
| DE | 102012219094 A1 | 5/2013 |
| DE | 102015206432 A1 | 10/2016 |
| DE | 102015208621 A1 | 11/2016 |
| DE | 102016203076 A1 | 8/2017 |
| RU | 2470374 C2 | 12/2012 |
| WO | 2008134443 A1 | 11/2008 |
| WO | 2013006625 A2 | 1/2013 |
| WO | 2017/144292 A | 8/2017 |

OTHER PUBLICATIONS

Office Action from Russian Application No. 2020 113017/28(022007) dated Nov. 9, 2022.
German Search Report issued in application No. DE102017123391.1 dated Oct. 25, 2018.
International Search Report and Written Opinion issued in application No. PCT/EP2018/077339 dated Jan. 18, 2019.
Norm IEEE 1902.1 Mar. 31, 2009, IEEE Standard for long wavelength wireless network protocol.
Visible Assets Inc. "Home," 2017, pp. 1-7.
Office Action from Chinese Patent Application No. 201880063750 dated Mar. 15, 2023.

* cited by examiner

DEVICE FOR CONTROLLING, MONITORING AND VISUALIZING CONSTRUCTION SITES

The present invention relates to an apparatus for controlling and/or monitoring and/or visualizing construction sites, comprising a detection device for detecting the position of a construction means at the construction site, wherein the detection device includes a signal transmitter to be mounted on the construction means for providing an identification signal identifying the construction means, and a signal evaluation device for receiving and evaluating the identification signal in order to determine the position of the construction means at the construction site.

To be able to efficiently control, plan and monitor the erection of buildings such as houses, bridges, railway stations or civil structures, it is helpful to automatically detect or determine the presence and the position of the required construction means at the construction side and to provide the same as data to a construction site master computer and/or a BIM server (Building Information Model). What is considered as construction means, whose presence and position at the construction site is detected, on the one hand are the required construction machines such as cranes, excavators, drilling devices, but in particular also construction materials to be installed at the building, such as facade elements, concrete parts such as precast concrete stairs, dormers, rafters, pre-fabricated wall parts or insulation boards and the like, and building materials such as sand, gravel, bricks, boards and the like as well as auxiliary construction tools such as formwork elements, supporting beams or scaffolding parts.

To locate and identify such construction means, it is known to use GPS transmitters and systems which are mounted on the respective construction means, wherein due to the price and the sensitivity such GPS systems in essence only are used for locating large, expensive construction machines such as cranes or crawlers, but not or rather to a reduced extent for smaller-scale construction means, which are installed at the building itself. In particular in the case of construction means to be installed at the building, the problem of how to again remove the GPS transmitters due to their price would arise. For example, the document WO 2013/006625 A2 discloses the use of a GPS system for the collection of 3D geodata for mobile or top-slewing cranes.

Independent thereof, the use of GPS systems for locating construction means at a construction site involves various disadvantages. Beside typical GPS shortcomings in terms of positional accuracy, which can be due to satellite errors for example in the form of changing orbits, atmospheric errors for example in the form of fluctuations in the propagation speed of radio waves as a result of atmospheric fluctuations, or influences of the satellite geometry for example in the form of a closely spaced satellite arrangement, signal reflections and shieldings above all are responsible for faulty determinations of the position. The radio waves used by GPS systems regularly propagate only linearly. When they impinge on conductive or mineral obstacles, they are reflected so that radio waves arriving at the receiver can be superimposed. Beside a possible mutual cancellation, extended runtimes also can occur as a result of the reflection, which render the position determination more difficult. In addition, shieldings occur in the case of massive walls or metal plates, which for example make it impossible to determine the position of a GPS module which is located at a construction means under a stack of metal plates or in the basement of the already partly erected building or at a similarly shielded position.

Furthermore, it has also been proposed already to use RFID transponders for locating and identifying construction means at construction sites. For example, the document DE 10 2004 055 033 describes a system for tracking objects at construction sites, in which the objects each are provided with an RFID transponder which each is coupled with a GPS module in order to report the current position of the object in response to a corresponding query. The documents US 2016/0034608 A1 or DE 10 2016 203 076 A1 disclose similar RFID systems for locating construction site components or building objects.

Such RFID systems are very attractive in terms of price so that theoretically they might also be used in less expensive construction means such as insulation boards or armoring irons. RFID transponders, however, are very susceptible as regards the communication connection to the evaluation device. For example, due to metal bodies or water surfaces signal reflections occur, which often entirely inhibit a signal detection. In addition, three separate antennas regularly are required in order to be able to determine the position of the RFID transponder by triangulation.

In general, these systems in principle require a "visual contact" between transmitter and receiver, i.e. a so-called "line of sight" is required between the satellite or the radio antenna on the one hand and the receiver in the form of a receiver or transponder on the other hand. In a construction site environment this rarely is possible so that previous detection systems have not asserted themselves on a large scale.

Proceeding therefrom, it is the object underlying the present invention to create an improved device as mentioned above, which avoids the disadvantages of the prior art and develops the latter in an advantageous way. In particular also in the environment of construction sites and the disturbing influences present there a reliably operating, inexpensive and robust detection system for determining the position and for identifying construction means at the construction site will be created.

According to the invention, said object is achieved by a device according to claim 1. Preferred aspects of the invention are subject matter of the dependent claims.

It hence is proposed to connect the signal transmitter to the evaluation device by means of inductive communication and to locate the same via magnetic radiation or waves. According to the invention, the signal evaluation device comprises at least one loop antenna laid at the construction site for receiving the identification signal of the signal transmitter and for determining the position of the signal transmitter. Such a loop antenna sometimes also is referred to as a magnetic loop antenna and is designed to respond to the magnetic component of the electromagnetic field or the identification signal. The identification signal which is provided by the signal transmitter substantially can be magnetic itself or at least comprise a significant magnetic fraction.

By means of such loop antennas, which respond to a magnetic identification signal or its magnetic component, considerable advantages can be achieved as compared to GPS-based or RFID-based systems. In particular, even in the case of massive metal bodies in the environment of the signal transmitter, for example in the form of metal plates, major water surfaces such as construction site puddles or conduits, or in the case of massive reinforced concrete ceilings or walls, no or only minor reflections or shieldings occur, so that regularly no "visual contact" is required between the signal transmitter and the loop antenna. At the same time, the use of a loop antenna provides for a position determination of the signal transmitter without three or more loop antennas being necessary, as this is the case for example in conventional triangulation methods.

When a coarser positioning at the construction site or possibly also the mere knowledge of the presence of a construction means is sufficient, a single loop antenna may be sufficient, which for example is laid along the outer borders of the construction site, in particular on or in the ground. A certain position determination of the signal transmitter within the area enclosed by the loop antenna still is possible, as a loop antenna can determine the direction from which a particular signal arrives and the strength of the signal in each portion of the loop antenna. Advantageously, the signal evaluation device connected to the loop antenna can be configured to determine the position of the signal transmitter relative to the loop antenna on the basis of the signal strength and/or signal frequency received in various portions of the loop antenna.

Alternatively, or in addition to such a loop antenna surrounding the entire construction site or at least a significant part of the construction site, a loop antenna can also be mounted at the entrance to a construction site in order to detect construction means with the delivery. Such a loop antenna at the entrance to the construction site for example can be arranged in an upright plane in the manner of an archway so that delivery vehicles can drive through the loop antenna. Alternatively or in addition, loop antennas can also be arranged merely laterally at a border of the construction site entrance and/or in the ground area of the construction site entrance so that the identification signals of the signal transmitters which are mounted on the construction means delivered can be detected when the delivery vehicle passes the construction site entrance.

Advantageously, a plurality of loop antennas can be provided, which are arranged in a plurality of sectors of the construction site, so that there is achieved a division of the construction site in terms of a detection via signals. It is advantageous that even loop antennas spread relatively close to each other do not mutually impair each other as regards the detection of different identification signals of different signal transmitters. In particular, the construction site or its base area can be divided into a plurality of sectors to each of which a loop antenna is associated, wherein the respective loop antenna for example is mounted along the respective sector edge, in particular can be laid in the ground or on the ground.

To provide for or facilitate a detection of components which are installed at the building, at least one loop antenna can also be laid at the building to be erected in accordance with an advantageous development of the invention. Advantageously, a plurality of loop antennas can also be laid at the building and be associated to various portions of the building. For example, a separate loop antenna can be associated to each floor of a building. Alternatively, or in addition, it is also possible that several loop antennas are spread on the same floor in order to separately cover different floor areas.

For example, when a precast concrete stair or a facade element is installed at the building, this is detected by the loop antenna by detecting the position of the signal transmitter in the area of the building monitored by the loop antenna. Monitoring of the building and of the progress of the construction work thereby can be realized reliably, in particular specifications made by the BMI concerning the installation of a component can be checked.

In principle, the at least one loop antenna can operate in different frequency ranges and/or detect identification signals of different wavelengths. In an advantageous development of the invention, the loop antenna can be designed to receive and/or emit long-wave signals in a wavelength range of 50 kHz to 500 kHz, in particular about 100 kHz to 250 kHz, in order to communicate with the signal transmitter.

To reduce disturbances by superimposed external signals, the loop antenna can be configured to only receive and/or emit a relatively narrow wavelength or frequency window which is adjusted to the signal transmitters and the identification signals output by the same, i.e. the signal windows of the loop antenna are determined such that they contain the wavelength or the frequency of the identification signal of the signal transmitters, but are relatively narrowly limited at the same time. For example, the loop antenna can be configured to receive and/or emit only one or more signal windows which each have a window width of less than 50 kHz or less than 25 kHz or less than 10 kHz.

The used signal transmitters advantageously are designed to emit a magnetic identification signal or an identification signal with a significant magnetic field fraction and/or to operate magnetically.

In particular, the signal transmitters can output a long-wave identification signal in the range of 50 kHz to 500 kHz, in particular 100 kHz to 250 kHz.

The signal transmitters can output short data packets of less than 512 Byte as an identification signal by using an active, wireless two-way protocol.

The signal transmitters can be bidirectional and/or operate on demand, in particular can be configured in the form of a transceiver which can actively send signals and receive signals. The signal transmitter can comprise an energy accumulator for example in the form of a battery or an accumulator in order to be able to send signals independent of the previous receipt. Alternatively, it would also be possible, however, to obtain energy from received signals and/or to convert received signals into response signals in order to then send a response signal.

For example, the signal transmitter can be configured according to the standard IEEE 1902.1, for example in the form of a RuBee tag.

The signal transmitter advantageously is configured to communicate with said loop antenna in the near field at a range of up to 100 m or up to 75 m or up to 50 m or also up to 25 m. Due to the configuration as a near-field communication module of limited range, the energy demand on the one hand can be strongly reduced, while on the other hand no disturbances can be induced in communication devices outside the construction site.

The signal transmitter advantageously is configured to chiefly output magnetic waves as a signal. Disturbances which are implied by electric fields thereby can largely be avoided.

The signal transmitter advantageously can be configured in the form of a small marking carrier or a tag or a label so that the signal transmitter can simply be mounted on the respective construction means, for example is adhered thereto or can be attached in some other way. Possibly, the signal transmitter can also be cast into the respective construction means, for example into a precast concrete part. As the signal transmitter operates magnetically, the signals sent and/or received by the signal transmitter are not impeded either when the signal transmitter is embedded into the material of the construction means.

The signal transmitter can also be embedded into construction means in the form of bulk material, for example into a heap of gravel or sand which is kept on the construction site. In the case of a sufficiently sensitive configuration of the signal transmitter, the same can also participate in unloading operations, for example when a heap of sand is delivered on a truck and is unloaded at the construction site.

The information or data obtained by the inductive communication between signal transmitter and loop antenna can be utilized in various ways in order to monitor and/or control and/or visualize the construction site. In particular, the construction means identified and determined in terms of their position can be used for controlling the construction machines, for example to the effect that the position of a respective construction means is communicated to a crane or a loader so that the crane or loader can automatically approach the pick-up point.

In particular, the data on the construction means and the position thereof can, however, also be used to monitor and/or to visualize a progress at the construction site. For this purpose, the identification and position data which were obtained from the detection of the construction means at the construction site can be fed into a data and information system which grants various user groups access to the data.

Advantageously, said data and information system can be configured to provide differently configured data groups for different users.

For example, for a first user group a first data set can be configured, which substantially comprises all data collected at the construction site. This first data group for example can comprise construction site information data which indicate what construction means are present at the construction site when and where. Furthermore, this can be machine data preferably in the form of real-time data, which provide information on construction machines present at the construction site, their activity and/or position. Furthermore, this can be BIM data, in particular three-dimensional building data and in addition time and/or cost data. Furthermore, image data in the form of visual camera data or in the form of imaging sensor data can be contained in said data set for the first user groups. This first data set for said first user group can be determined in particular for system providers, data administrators or the designers of the construction machine manufacturers.

Said data and information system furthermore can configure a second data group which is determined for another, second user group, wherein such a second data set can be reduced as compared to the first-mentioned data set. In particular, the aforementioned construction site information data, said BIM data and possibly said image data can be contained in the second data set. Such a second data set can be communicated and/or be retrievably provided to users of a second user group, for example to the suppliers for the building materials such as sand, gravel etc. and the construction materials such as concrete components, facade elements and the like as well as the logistics companies for delivering and handling the construction means.

Furthermore, it may be expedient to configure and provide a third data group for a third user group. The data of this third data group in principle can be similar to the data of the second data group, for example comprise the construction site information data and the BIM data, wherein the image data can be omitted or also be included. Such a third user group for example can be project planners, architects and infrastructure project planners.

Advantageously, a fourth data group in particular also is configured by the data and information system for a fourth user group, wherein such a fourth data group advantageously can contain abstracted and/or generalized and/or less detailed construction site information data, for example weather, temperature and construction site status data. Furthermore, the fourth data group can comprise abstracted BIM data which are configured for use in augmented reality applications on screens or augmented reality glasses, in particular such that they can be visualized by augmented reality applications. Such abstracted BIM data in particular can comprise the current status of the building, for example what store the shell has reached and/or whether the roof is assembled already and/or whether facade elements are mounted already so that the current status of the building can be visualized for the fourth user group.

Advantageously, in addition to said abstracted construction site information data and/or abstracted BIM data real data, in particular image data of a camera and/or imaging sensor data can be contained in the fourth data group, which likewise can be configured for use in augmented reality applications. Upon retrieval of the data from the fourth data group by a user of the fourth user group, augmented reality applications or mixed reality applications thereby can be represented, i.e. be displayed on a screen or on a pair of augmented reality glasses.

Advantageously, further data for a fifth user group can be configured into a fifth data group which in particular can contain the BIM data, i.e. for example material and 3D building data which are relevant for the demolition and the disposal of the materials installed. Such a data group in particular can be provided for wrecking companies and recycling companies.

Figure 2:
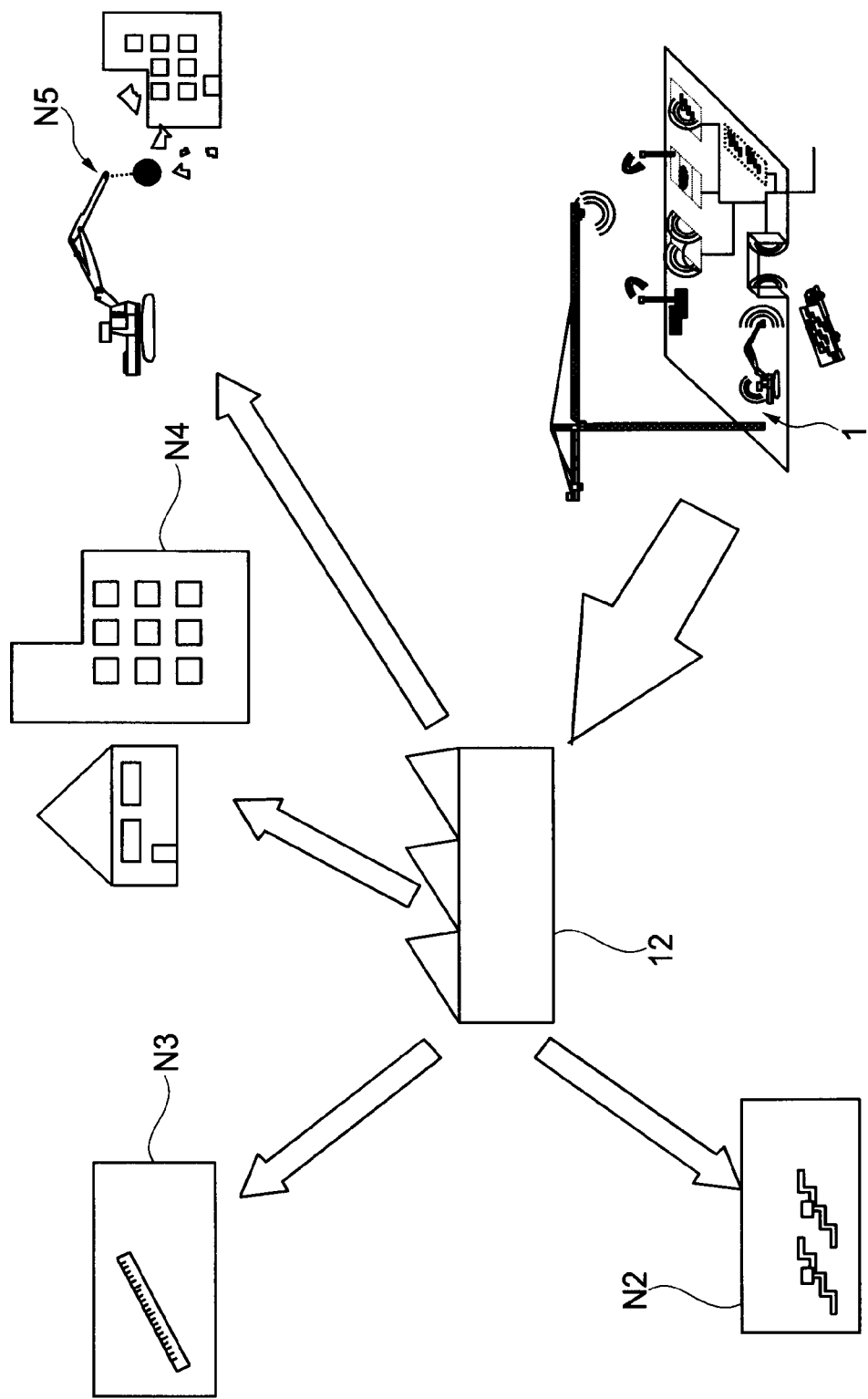
Figure 3:
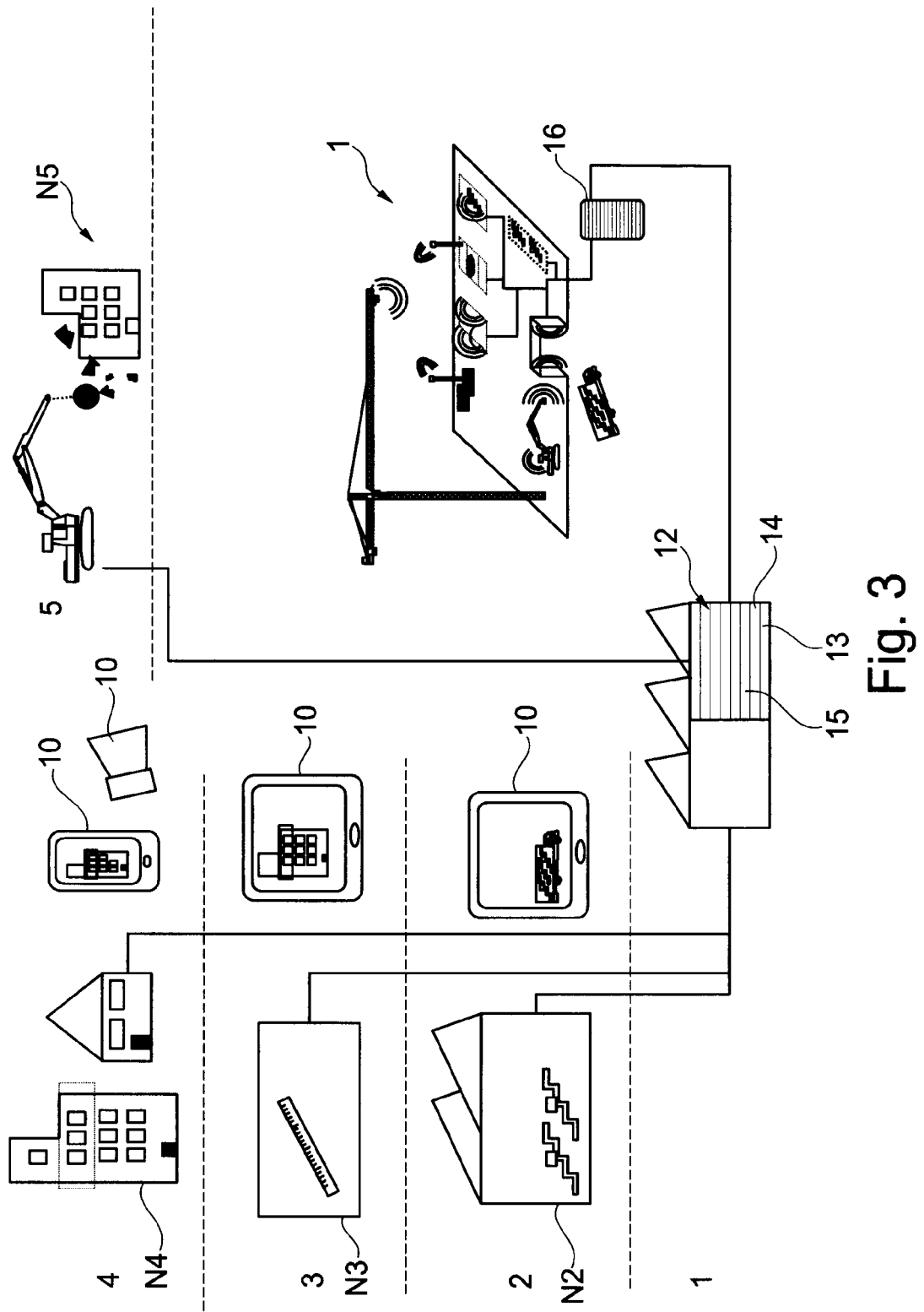

The invention will subsequently be explained in detail with reference to a preferred exemplary embodiment and associated drawings. In the drawings:

FIG. 1: shows a schematic representation of a construction site which is divided into different sectors comprising different loop antennas for the detection of construction means present in the sectors, FIG. 2: shows a schematic representation of the connection of the construction site of FIG. 1 to a data and information system in which the collected identification and position data of the construction means used at the construction site are stored, configured into different data sets and provided to different data users, and FIG. 3: shows a schematic representation of the differently configured data sets of the data and information system of FIG. 2 for different user groups.

As shown in FIG. 1, a construction site 1 on which a building 2 for example in the form of a building or house is erected in a manner known per se can comprise different sectors 1$a$, 1$b$, 1$c$ . . . 1$n$, in which different construction means are stored or kept ready or installed or also pre-mounted at the building 2. For example, stackable construction material for example in the form of bricks and/or prefabricated wall components can be kept ready in a first construction site sector 1$a$. For example, bricks or dry construction wall parts stacked on pallets can be stored there.

In a second construction site sector 1$b$, for example bulk material in the form of sand can be stored.

In another construction site sector 1$c$, bulk material in the form of gravel or a similar material can likewise be stored.

In another construction site sector precast concrete components such as for example a staircase can be kept ready.

In another construction site sector 1$n$ other construction elements such as for example facade elements, but also auxiliary construction elements such as formwork elements or supporting struts or scaffolding parts can be stored.

To each of said construction means 3 a signal transmitter 4 can each be associated, which emits an identification signal identifying the respective construction means 3. Said signal transmitter 4 can be attached to the respective component, wherein in the case of the described bulk material in the construction site sectors 1*b* and 1*c* the respective signal transmitter 4 can be loosely embedded in the bulk material.

Said signal transmitters 4 each send an individually coded, preferably short identification signal, which individually identifies each construction means.

The signal transmitters 4 advantageously are configured to operate magnetically and emit said identification signals with a significant magnetic field fraction in the near field with a limited range of for example less than 30 m.

Advantageously, the signal transmitters 4 are configured as transceivers in the way already described above, in particular in the form of a so-called RuBee tag.

To detect the magnetic component of the identification signals of the signal transmitters 4, loop antennas 5 can be provided at the construction site 1, which respond to the magnetic component of signals and are adjusted to the wavelength range of the signal transmitters 4. For example, said signal transmitters 4 can transmit in a frequency range of 100 to 150 kHz, wherein the loop antennas 5 advantageously are designed to process signals in one or more wavelength windows of relatively narrow window width. For example, the loop antennas 5 can be designed to respond to signals within a window width of about 10 kHz around the frequency of the signal transmitters 4.

As shown in FIG. 1, a first loop antenna 5 can be associated to a construction site entrance 6 in order to detect construction means 3 or signal transmitters 4 associated to the same upon delivery to the construction site 1. For example, when a delivery truck is driving construction means 3 provided with signal transmitters 4 through the construction site entrance 6, said loop antenna 5 can detect the signals of the signal transmitters 4 and identify the construction means 3 brought to the construction site.

It is also possible that a plurality of loop antennas 5 are associated to the construction site entrance 6, for example each laterally to the right and left and/or above and/or below the passageway, in order to reliably detect delivered construction means 3.

Alternatively, or in addition to such a loop antenna at the construction site entrance 6, a loop antenna 5 can be laid at the edges or boundaries of the construction site 1 in order to substantially cover the entire construction site area.

Alternatively, or in addition, a respective loop antenna 5 can be associated to each of said construction site sectors 1*a* to 1*n*, wherein the loop antennas 5 in particular can each enclose the edges of the respective construction site sector. For example, said loop antennas 5 each can be laid on the ground or also in the ground, cf. FIG. 1.

Said loop antennas 5 on the one hand are connected to a central data and information server 12, possibly via a construction site master computer 16, in order to transmit the detected information to said server 12. Said information on the one hand includes the identification codes identifying the individual construction means 3. On the other hand, this information includes the position data indicating the respective position of the detected construction means 3 at the construction site 1. These position data on the one hand can include the positions of the different loop antennas 5 in the different construction site sectors, for example such that a particular construction means 3 is positioned in sector 1*b*. Alternatively, or in addition, the position data can, however, also be even more detailed or specified to the effect that the position of a construction means 3, more exactly of the signal transmitter 4 connected thereto, relative to the respective loop antenna 5 is determined in more detail. As explained above, the position of a signal transmitter 4 relative to the loop antenna 5 can be determined in more detail from the signal strength in various portions of a loop antenna 5, for example such that a signal transmitter 4 is arranged exactly in the center of the space enclosed by the loop antenna or is positioned out of the center at a certain distance to a particular loop antenna portion. This can be determined by a signal evaluation device 8 connected to each of the loop antennas 5.

On the other hand, the signal transmitters 4 can also communicate with each other in the sense of a peer-to-peer system. For this purpose, a corresponding signal transmitter 4 and/or a loop antenna 5 can also be mounted on one of the construction machines 9, for example on the illustrated crane and/or the illustrated excavator, in particular a RuBee tag as explained above or a similar transceiver which can directly communicate with another transceiver or signal transmitter.

Such a direct communication for example can include the fact that after the detection of a particular construction means 3 in a particular construction site sector 1*c* a signal transmitter 4 mounted on the construction machine 9, for example on the crane, communicates directly with the signal transmitter 4 of a particular construction means, when for example a master computer has informed the construction machine 9 that a construction means of a particular type is to be picked up in the next step so that the construction means so to speak queries where exactly a construction means 3 with the corresponding identification code is located.

As shown in FIG. 2, the identification and position data stored in the central data and information system 12 can also be provided to different user groups, for example by actively forwarding the data to the respective user group in the sense of a push function, or by retrievably providing the data to the respective user group for a pull function.

Advantageously, different data sets can be configured by the data and information server 12 and/or the access rights can be configured differently for different user groups.

In particular, the data can be used to monitor and/or to visualize a progress at the construction site 1 via the construction means and the position thereof. For this purpose, the identification and position data, which were obtained from the detection of the construction means 3 at the construction site 1, can be fed into the data and information system 12.

For example, for a first user group a first data set can be configured, which substantially comprises all data collected at the construction site 1. This first data group can comprise for example construction site information data which indicate what construction means 3 are present at the construction site 1 where and when. Furthermore, this can be machine data preferably in the form of real-time data, which provide information on construction machines present at the construction site, their activity and/or position. Furthermore, this can be BIM data, in particular three-dimensional building data and in addition time and/or cost data. Furthermore, image data in the form of visual camera data or in the form of imaging sensor data can be contained in said data set for the first user group. This first data set for said first user group can be determined in particular for system providers, data administrators or the designers of the construction machine manufacturers.

Said data and information system 12 furthermore can configure a second data group which is intended for another, second user group N2, wherein such a second data set can be reduced as compared to the first-mentioned data set. In particular, the aforementioned construction site information data, said BIM data and possibly said image data can be contained in the second data set. Such a second data set can be communicated and/or be retrievably provided to users of the second user group N2, for example to the suppliers of the building materials 3 such as sand, gravel etc., and of the construction materials such as concrete components, facade elements and the like, and to the logistics companies for delivering and handling the construction means, cf. FIGS. 2 and 3.

Furthermore, it may be expedient to configure and provide a third data group for a third user group N3. The data of this third data group in principle can be similar to the data of the second data group, for example comprise the construction site information data and the BIM data, wherein the image data can be omitted or also be included. Such a third user group for example can be project planners, architects and infrastructure project planners.

Advantageously, a fourth data group also is configured by the data and information system in particular for a fourth user group N4, wherein such a fourth data group advantageously can contain abstracted and/or generalized and/or less detailed construction site information data, for example weather, temperature and construction site status data. Furthermore, the fourth data group N4 can comprise abstracted BIM data which are configured for use in augmented reality applications on screens 10 or augmented reality glasses, in particular such that they can be visualized by augmented reality applications. Such abstracted BIM data in particular can comprise the current status of the building, for example what floor the shell of the building has reached and/or whether the roof is assembled already and/or whether facade elements are mounted already so that the current status of the building can be visualized for the fourth user group N4, cf. FIG. 3.

Advantageously, in addition to said abstracted construction site information data and/or abstracted BIM data real data, in particular image data of a camera and/or imaging sensor data can be contained in the fourth data group, which likewise can be configured for use in augmented reality applications. As a result, upon retrieval of the data from the fourth data group by a user of the fourth user group N4, augmented reality applications or mixed reality applications can be represented, i.e. be displayed on a screen 10 or on a pair of augmented reality glasses, cf. FIG. 3.

Advantageously, for a fifth user group N5 further data can be configured into a fifth data group which in particular can contain the BIM data, i.e. for example material and 3D building data, which are relevant for the demolition and the disposal of the installed materials. Such a data group can be provided in particular to wrecking companies and recycling companies, cf. FIGS. 2 and 3.

In particular, the data and/or information server 12 can perform a matching between planning and/or logistics data, which are stored in the BIM, and the data collected via the loop antenna 5 and the signal transmitters 4 and evaluated by the signal evaluation device 8, in order to monitor the construction progress, in particular whether construction steps stored in the BIM actually have also been carried out already. For this purpose, in particular the information as to whether a particular construction means 3 has already been installed in the building 2 can be useful. For example, this can be the information of whether a particular precast concrete staircase or a particular facade element has already been installed at the building 2 and correspondingly has been detected by the loop antenna associated to the building 2.

The data kept ready in the data and information server 12 can also be configured for the visualization of the construction site 1 and/or the building 2 in order to be displayed on a display device 10 of a respective user group. As already explained above, this can be a normal screen on a PC or the screen 10 of a mobile device such as a tablet or also a pair of augmented reality glasses. Advantageously, the data and information server 12 and/or a configuration module connected thereto configures the data provided for the visualization such that a visualization software installed on the respective terminal device can represent the construction site 1 and in doing so take account of the particular information on the presence and/or position and/or the installation status of the construction means 3.

The invention claimed is:

1. A logistics system for construction units comprising:
one or more signal transmitters, each configured to be mounted on a construction unit and to provide identifying information related to the construction unit to which it is mounted, the identifying information comprising an electromagnetic signal; and
a signal evaluation device comprising one or more loop antennas, each loop antenna configured to:
receive the identifying information from a first signal transmitter of the one or more signal transmitters by detecting a magnetic component of the electromagnetic signal when the first signal transmitter is in proximity to the loop antenna; and
evaluate the received identifying information;
wherein the one or more loop antennas are positioned about a construction site; and
wherein the system detects the presence and position of construction units at the construction site.

2. The logistics system of claim 1, wherein:
the system is configured to monitor positions of at least a portion of the construction units about the construction site via the evaluated received identifying information from at least a portion of the loop antennas; and
at least a portion of the construction units are selected from the group consisting of construction machines, construction materials, building materials, and construction tools.

3. The logistics system of claim 2, wherein one or more of:
at least a portion of the one or more signal transmitters are configured as transceivers;
at least a portion of the one or more signal transmitters comprise an energy accumulator for actively generating signals representative of the identifying information;
at least a portion of the one or more signal transmitters comprise a microprocessor with an associated memory module;
at least a portion of the one or more signal transmitters comprise at least one sensor from the group consisting of a temperature sensor, humidity sensor, acceleration sensor, brightness sensor, and pressure sensor; and
the signal evaluation device is configured to determine the position of a respective signal transmitter of the one or more signal transmitters relative to a respective loop antenna of the one or more loop antennas with reference to a signal strength induced in different loop antenna portions of the respective loop antenna.

4. The logistics system of claim 2, wherein the one or more signal transmitters are further configured to directly communicate with each other in the manner of a peer-to-peer system.

5. The logistics system of claim 2, further comprising a central information unit in information communication with the signal evaluation device;
   wherein the central information unit is configured to store identification and position data of at least a portion of the construction units detected at the construction site.

6. The logistics system of claim 5, wherein the central information unit comprises:
   a visualization configurator module for configuring visualization data; and
   a transmitter module for transmitting the visualization data;
   wherein the visualization data is:
      related to the stored identification and position data; and
      presented on a display device in communication with the transmitter module.

7. The logistics system of claim 5, wherein the central information unit comprises a monitoring module configured to:
   monitor building progress of a building at the construction site;
   match planning data from a building information model (BIM) with the stored identification and position data; and
   determine from such matching whether a building step contained in the planning data of the BIM has been executed.

8. The logistics system of claim 6, wherein the visualization configurator module is further configured to generate image data in dependence on signals representative of the identifying information detected by at least a portion of the one or more loop antennas and position data of at least a portion of the construction units determined therefrom;
   wherein the image data defines a respectively updated image of the construction site.

9. The logistics system of claim 1, wherein each signal transmitter of the one or more signal transmitters is further configured to provide the identifying information in a wavelength range between 50 kHz and 500 kHz.

10. The logistics system of claim 1, wherein each loop antenna of the one or more loop antennas is further configured to respond to the identifying information in a wavelength range of 50 kHz to 500 kHz.

11. The logistics system of claim 1, wherein each signal transmitter of the one or more signal transmitters is further configured as an inductive near-field communication module with a signal range of less than 100 m.

12. The logistics system of claim 1, further comprising a server configured to:
   receive the evaluated identifying information;
   generate dynamic visualization of the construction site comprising presence of the construction units, position of the construction units, installation status of the construction units, or combinations thereof; and
   transmit the dynamic visualization of the construction site to a display device, a mobile device, an augmented reality device, or combinations thereof.

* * * * *